United States Patent [19]

Douglas et al.

[11] Patent Number: 4,538,104
[45] Date of Patent: Aug. 27, 1985

[54] IN-CIRCUIT TEST APPARATUS FOR PRINTED CIRCUIT BOARD

[75] Inventors: Bruce S. Douglas, San Jose; Chester V. Westergart, Scotts Valley, both of Calif.

[73] Assignee: Test Point 1, Inc., San Jose, Calif.

[21] Appl. No.: 483,696

[22] Filed: Apr. 11, 1983

[51] Int. Cl.³ .............................................. G01R 31/02
[52] U.S. Cl. ............................ 324/158 F; 324/73 PC
[58] Field of Search .......... 324/158 F, 158 P, 73 PC; 277/226

[56] References Cited

U.S. PATENT DOCUMENTS

| | | | |
|---|---|---|---|
| 2,607,966 | 8/1952 | Beck | 277/226 X |
| 4,322,682 | 3/1982 | Schadwill | 324/158 F |
| 4,344,033 | 8/1982 | Stowers et al. | 324/73 PC X |
| 4,352,061 | 9/1982 | Matrone | 324/158 F |
| 4,357,062 | 11/1982 | Everett | 324/73 PC X |

Primary Examiner—Stewart J. Levy
Assistant Examiner—S. Baker
Attorney, Agent, or Firm—Thomas E. Schatzel

[57] ABSTRACT

An in-circuit test apparatus having a vacuum chamber between a top plate and a base plate. The apparatus has an adjustable bearing block assembly located at each quandrant to provide a precision alignment between the top plate and the base plate. A continuous double-hollow tube is located in a uniform groove in the base plate and forms a seal when held captive between the top plate and the base plate. A plurality of spring probe pressure pins are mounted within the chamber. The pins project through drilled individual access ports in the top plate and make electrical contact with a printed circuit board under test when the top plate collapses under a vacuum.

17 Claims, 8 Drawing Figures

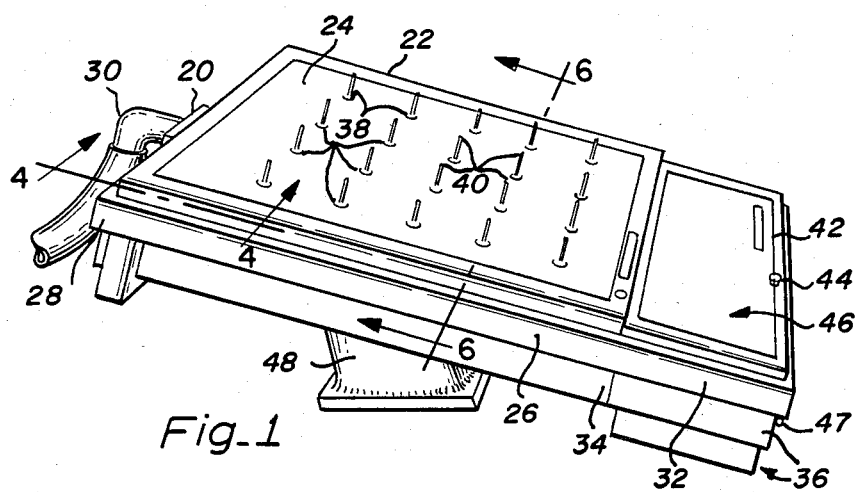
Fig_1
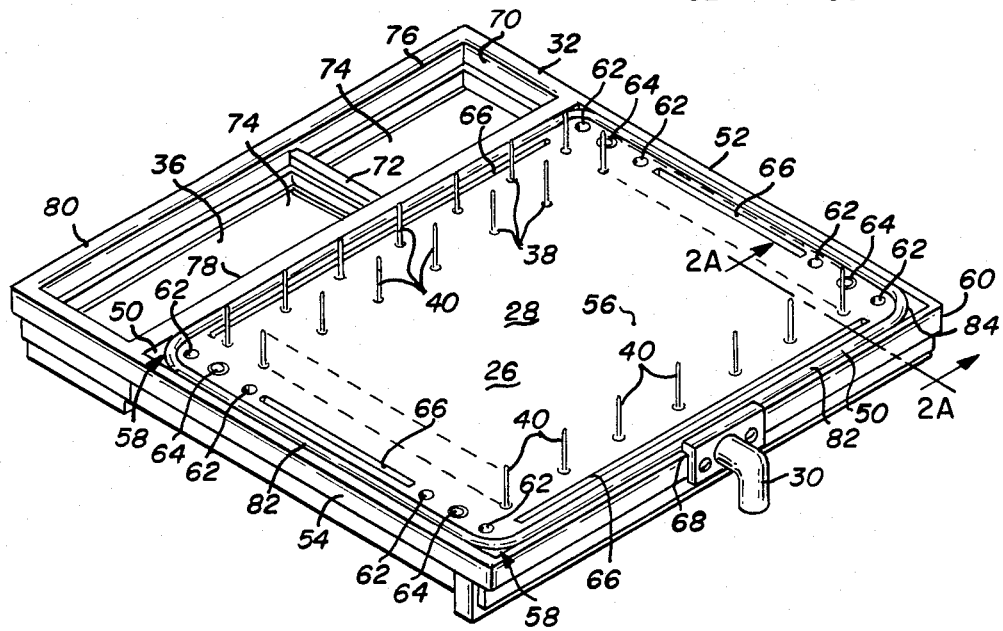
Fig_2
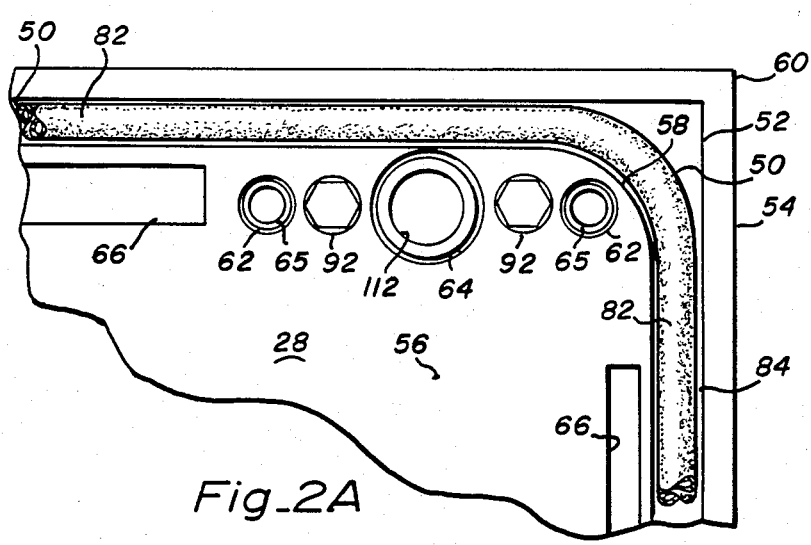
Fig_2A

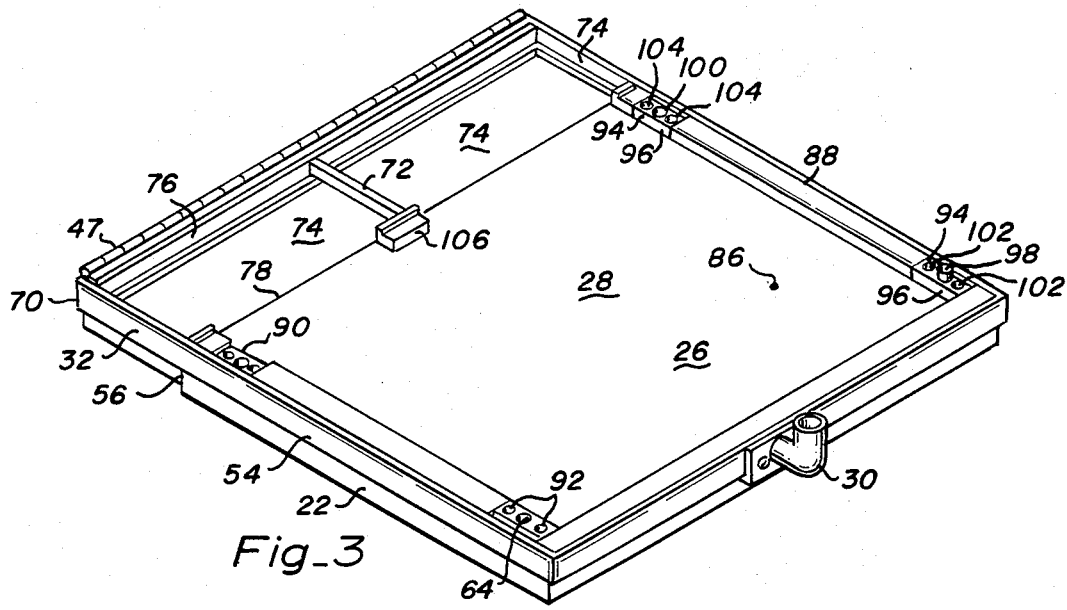
Fig_3
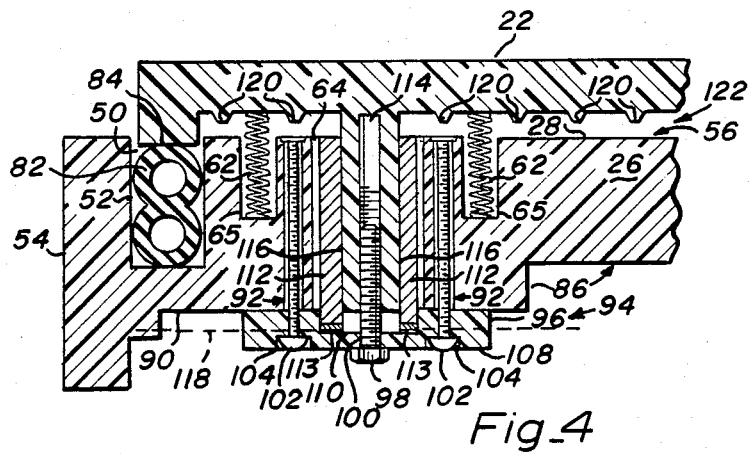
Fig_4
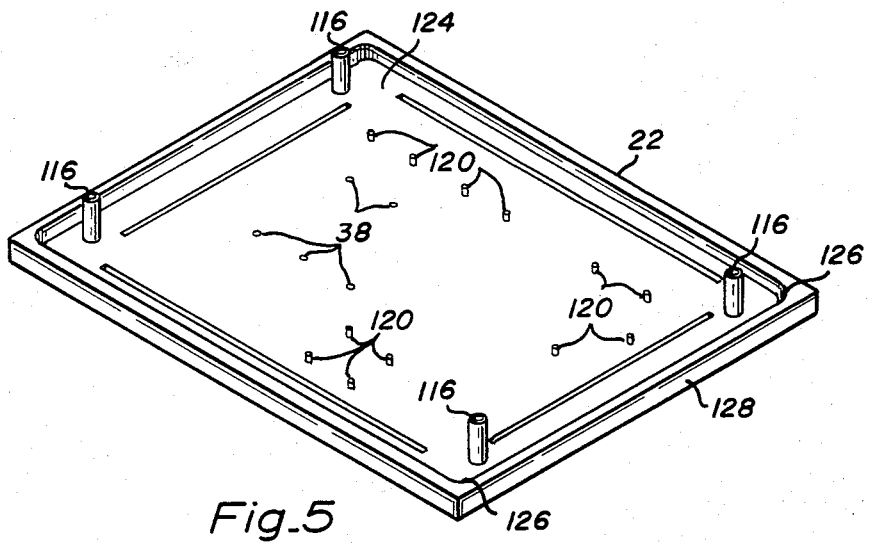
Fig_5

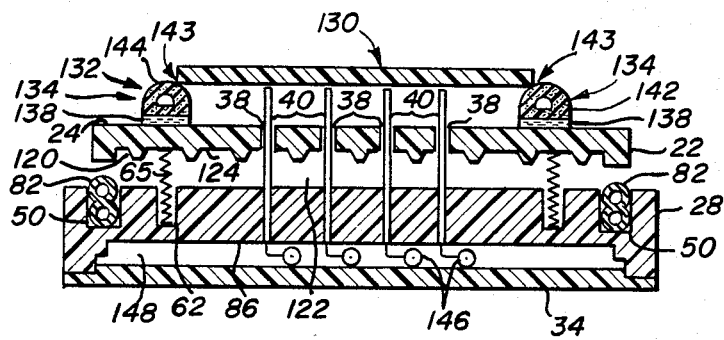
Fig_6
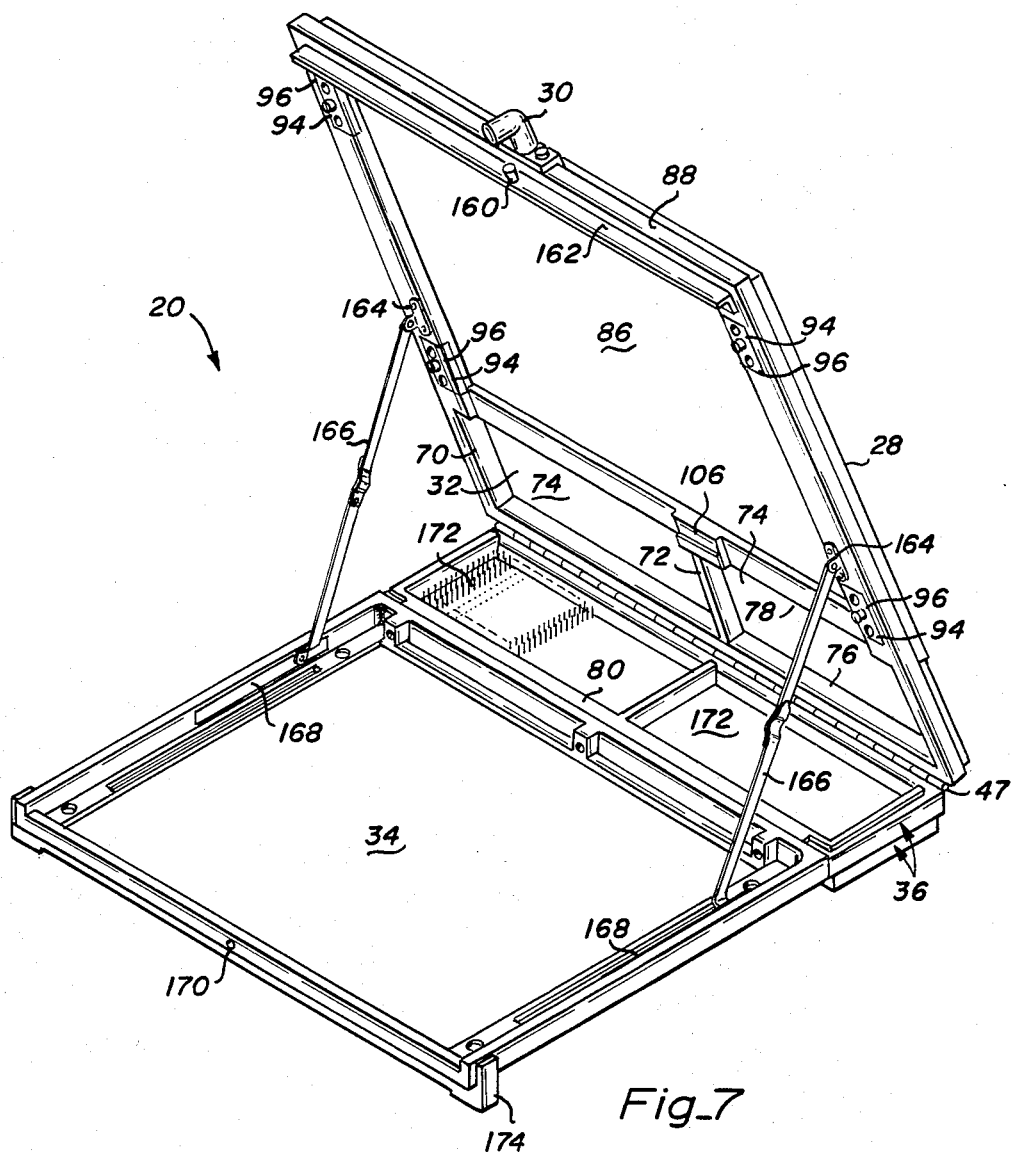
Fig_7

IN-CIRCUIT TEST APPARATUS FOR PRINTED CIRCUIT BOARD

BACKGROUND OF THE INVENTION

1. Field of the Invention

This invention relates generally to in-circuit testing apparatus and more particularly to an improved in-circuit test apparatus for printed circuit boards having an improved alignment and vacuum system for reliable contact with the circuit boards and utilizing sensitive spring probes for interfacing with a circuit analyzer.

2. Description of the Prior Art

In the field of printed circuit card testing, it is common to isolate and verify the individual components or test points in an integrated circuit board with a test connector. After each part is individually tested and proven functional, the printed circuit board is deemed to operate properly.

In the 1950s, the General Electric Company introduced the first in-circuit testing system. This system, referred to as "Guarding", was an electronic means designed to analyze the individual components in an integrated electrical circuit. In this test mode, multiple probes connected to a circuit analyzer on one end were tied to all the test points of a printed circuit card at the other end. Thus, "Guarding" resulted in increased visibility of the circuit card under test. Later, improvements were developed in analyzers manufactured by Systemation, Fairchild, and Zhentel.

In order to accomplish this method of testing, fixturing coupled with "Guarding" formed the basis for in-circuit testing. These fixtures generally included spring probes projecting out of the top of the test fixture and the circuit board under test was set on top of the fixture. The fixture was designed such that a space existed between the bottom and top of the fixture and an apparatus for drawing a vacuum in that space was connected thereto. Then, a vacuum was applied to the circuit board through the penetrations for the spring probes in the top part drawing the circuit board down against and making electrical contact with the spring probes. The spring probes were electrically connected by circuit wiring to an in-circuit electronic analyzer which performed a circuit analysis upon the vacuum held circuit board. Various problems have existed in the in-circuit test fixtures as herein described.

In order for the probes to make contact with the proper test points of the circuit board, the bottom stationary plate and the top plate supporting the circuit board under test must remain in a parallel relationship. Prior attempts to accomplish this requirement included utilizing cold-rolled steel pins with guide bushings. In the manufacturing environment, one machinist would drill the bottom plates while another machinist would drill the top plates. The result was that the holes failed to properly align and when the steel pins were inserted, a nonbinding fit was not achieved. To hold the circuit board to the top plate, a vacuum was applied resulting in the warping of the top panel, loss of vacuum seal, and misdirection of the spring probes onto the circuit board.

A second problem was that the prior art utilized a vacuum sealant system between the stationary bottom plate and the top plate that supported the circuit board. Such sealing system utilized square corners which made holding the vacuum between the plates difficult. For example, the Fairchild vacuum seal was a flat, hard rubber wiping seal that once it became activated, in addition to having square corners, resulted in vacuum leakage and poor electrical contact between the spring probes and the circuit board under test.

Because each test probe must be electrically insulated from all other probes to obtain reliable test data, the component parts of the test fixture must be constructed of an electrical insulating material. Thus, prior attempts to satisfy this condition led to the use of plastic parts and the machining of alignment holes therein. Due to the chemical composition of plastics, environmental conditions such as humidity, heat, and cold result in the warping and shrinkage of the plastic and the ultimate misalignment of the machine drilled holes.

A further problem with the previous designs, especially the Fairchild "Thinline" vacuum fixture, involved the spring probe access holes in the top component and the vacuum seal located between the circuit board under test and the top component. Referring to the problem involving the spring probe access holes, the top and bottom plate components are drilled separately in the production environment. Thus, the tolerances caused the guide system and guide pins to misalign and typically there was no method to adjust or compensate for drilling error. Also, if the plates were fabricated from plastic, the previously described material distortion could also cause misalignment. Therefore, the access hole for each spring probe had to be large to compensate for the high tolerance guide system to prevent damage to the probes when the component plates collapsed upon one another under vacuum. In particular, when test points on the circuit board were close together, the spring probes projecting from the bottom plate component were closely spaced. Therefore, large access holes had to be drilled adjacent to one another and consequently the chain of holes became a continuous hole in the top component accommodating many probes. This resulted in limited protection for and likelihood of damage to each individual probe. The second component of this problem involved a vacuum seal that must exist to retain vacuum between the circuit board under test and the top component to hold the circuit board in position. Normally, this vacuum is achieved by the same vacuum between the top and bottom plate components through the spring probe access holes previously described. In order to prevent the loss of this vacuum, a peripheral seal was designed to be placed between the circuit board and the top plate. This peripheral seal was usually comprised of a thick foam rubber material as in the Fairchild "Thinline" model. When initially fitted, the thick foam rubber seal caused uneven distribution of vacuum pull on the circuit board resulting in the bowing of the circuit board. Such distortion caused the probes contacting the circuit board center to make excessive contact while the probes contacting the circuit board periphery made insufficient contact. Also, the thick foam rubber would tend to depress under vacuum pressure and become contaminated causing the seal to leak and reduce the probe-circuit board contact even further.

In addition to vacuum leakage resulting from poor seals, the problem of intermittent or total loss of vacuum plagued the prior art. Because of misalignment and warping of the component plates when under vacuum, the plates would physically touch one another and either temporarily or permanently eliminate the vacuum. This action resulted in chattering of the two plates preventing continuous electrical contact between the probes and the circuit board under test. Attempts to solve this problem by the Fairchild Company resulted in utilizing a sheet of fiberglass or phoenolic material as a top plate and gluing rubber stops directly to the bottom plate. The purpose of the rubber stops were to eliminate the loss of vacuum by maintaining a separation distance between the component plates. As with the previously described plastic component plates, environmental factors caused the rubber stops to wear and loose adhesion to the bottom plate.

Finally, maintenance access to the interior of the test fixture of the prior art required the removal of multiple screws or bolts from the plate components. Thus, in order to make any adjustments to the spring probes, the vacuum seal or the vacuum connection, the test fixture had to be removed from service. This required the tedious disassembly of the test fixture by maintenance personnel to remedy the situation.

SUMMARY OF THE PRESENT INVENTION

It is therefore an object of the present invention to provide an in-circuit test apparatus capable of precisely aligning the top plate with the base plate.

It is a further object to provide an in-circuit test apparatus having a highly efficient vacuum sealing system.

It is a further object to provide an in-circuit test apparatus which is injection molded and is functional without possessing the design accuracy as heretofore required.

It is a further object to provide an in-circuit test apparatus having individually adjustable assembly points to achieve proper alignment.

It is a further object to provide an in-circuit test apparatus having reliable spring probe contact with the printed circuit board under test.

It is a further object to provide an in-circuit test apparatus which is conveniently serviceable while remaining in the production environment.

It is a further object to provide an in-circuit test apparatus having an individual guide port for each spring probe pressure pin.

Briefly, a preferred embodiment of the present invention includes an in-circuit test apparatus for printed circuit boards with improved alignment and a superior vacuum seal between two parallel injection-molded plates. One is a stationary base plate including a continuous uniform groove with rounded interior corners and having a continuous double hollow tube forming a seal in the absense of vacuum. Mounted on the bottom surface of the base plate beneath each rounded interior corner is a bearing block assembly having a guide shaft passing through a linear bearing and a base plate penetration to a threaded receptacle located on the bottom surface of a vertical traveling top plate. Each bearing block assembly is individually adjustable to permit precise parallel alignment between the top plate and the base plate forming a vacuum chamber therebetween. The top plate supports and vacuum seals a circuit board under test and includes individual access ports for spring probe pressure pins that are mounted within the base plate and project through the top plate permitting reliable electrical contact between the circuit board and an external test device.

A vacuum is drawn within the chamber and is maintained by the efficient double hollow tube seal fitting the rounded interior corners. The individual bearing block assemblies permit a non-stress, parallel alignment between the base plate and the top plate preventing warping of the top plate as the top plate and the circuit board travel without binding down the guide shaft to the base plate completely sealing the chamber. The spring probes are then guided and protected by the individual access ports as they penetrate the top plate. The absence of warping of the top plate permits reliable spring probe contact with the circuit board and the individual adjustable bearings also permit functional injection-molded construction without the previously required machining accuracy. Upon release of the vacuum, return springs within the base plate vertically reposition the top plate withdrawing the spring probes from the circuit board under test. Additionally, a screw cap on the guide shaft is designed to be turnably releasable permitting internal serviceability of the test apparatus while in the production environment.

An advantage of the in-circuit test apparatus of the present invention is that the top plate and the base plate are precisely aligned.

Another advantage is that the in-circuit test apparatus has a highly efficient vacuum sealing system.

A further advantage is that the in-circuit test apparatus is injection molded and is functional without possessing the design accuracy as heretofore required.

A further advantage is that the in-circuit test apparatus has individually adjustable assembly points to achieve proper alignment.

A further advantage is that the in-circuit test apparatus has reliable spring probe contact with the printed circuit board under test.

A further advantage is that the in-circuit test apparatus is conveniently serviceable while remaining in the production environment.

A further advantage is that the in-circuit test apparatus has an individual guide port for each spring probe pressure pin.

These and other objects and advantages of the present invention will no doubt become obvious to those of ordinary skill in the art after having read the following detailed description of the preferred embodiment which is illustrated in the various drawing figures.

IN THE DRAWING

FIG. 1 is a perspective view of an in-circuit test apparatus in accordance with the present invention;

FIG. 2 is a top perspective view of the base plate of the in-circuit test apparatus of FIG. 1;

FIG. 2A is a partial plan detail of the in-circuit test apparatus base plate corner taken along the line 2A—2A of FIG. 2;

FIG. 3 is a bottom perspective view of the base plate of the in-circuit test apparatus of FIG. 1;

FIG. 4 is a cross-sectional view of the in-circuit test apparatus bearing block assembly taken along the line 4—4 of FIG. 1;

FIG. 5 is a bottom perspective view of the top plate of the in-circuit test apparatus of FIG. 1;

FIG. 6 is a cross-sectional view of the in-circuit test apparatus taken along the line 6—6 of FIG. 1; and FIG. 7 is a perspective view of the baseplate-bottom cover plate open position of the in-circuit test apparatus of FIG. 1.

DETAILED DESCRIPTION OF THE PREFERRED EMBODIMENT,

In FIG. 1, there is illustrated a perspective view of an in-circuit test apparatus referred to by the general reference character 20 and incorporating the present invention. The in-circuit test apparatus 20 includes a top plate 22 having a flat top upper surface 24 and mounted above a first section 26 of a base plate 28 which has a vacuum inlet 30 attached thereto. Baseplate 28 is also comprised of a second section 32. The bottom of the first section 26 of base plate 28 is covered by a bottom cover plate 34 and the bottom of the second section 32 of baseplate 28 is covered by a tester interface 36. Additionally, a plurality of individual access ports 38, precision drilled through top plate 22, permit a plurality of spring probe pressure pins 40 anchored in baseplate 28 to project through top plate 22. A top access cover plate 42, having a thumb screw release 44 and a flat, smooth upper surface 46 is mounted atop the second section 32 of baseplate 28 adjacent to top plate 22. The baseplate 28 is connected to the bottom cover plate 34 by a hinge 47 where the external edges of the second section 32 of baseplate 28 and the tester interface 36 meet. Thus, the baseplate 28 may be rotated approximately sixty degrees about tester interface 36 at hinge 47. The entire in-circuit test apparatus 20 is supported by an external test device 48.

FIG. 2 illustrates the upper surface of baseplate 28 and includes a continuous uniform groove 50 within a baseplate edge member 52 formed with a vertical outer wall 54. The baseplate 28 has a flat, smooth-surfaced top 56 and a set of four molded, rounded interior corners 58 within a set of four corners 60 of the continuous uniform groove 50. Within each of the four rounded interior corners 58 and smooth-surfaced top 56 there is a cylindrical cavity 62 on each side of a baseplate penetration 64. Also between adjacent cylindrical cavities 62 and parallel to the continuous uniform groove 50 there is a molded channel slot 66. An external penetration 68 through the vertical outer wall 54 accommodates the vacuum inlet 30 as shown in FIG. 1. Also shown are the spring probe pressure pins 40 projecting from the smooth-surfaced top 56. Note, baseplate 28 also has an outer frame 70 with a center frame member 72 forming a twin rectangular opening 74 with an outer edge 76 and an inner edge 78. When the baseplate 28 is collapsed upon the bottom coverplate 34, the outer frame 70 is congruent with a top frame member 80 of the previously mentioned tester interface 36. The continuous uniform groove 50 also includes a continuous double-hollow tube 82 comprised of extruded silicone that forms a first vacuum seal 84 between the top plate 22 and the baseplate 28.

FIG. 2A further illustrates the upper surface of baseplate 28 with a partial corner detail including the groove 50 within the base plate edge member 52 formed with vertical outer wall 54. The smooth-surfaced top 56 terminates with the rounded, interior corner 58 within corner 60 of groove 50. The cylindrical cavity 62 located on each side of base plate penetration 64 includes a return spring 65 mounted in each cylindrical cavity 62. Also, molded channel slot 66 is shown parallel to and inward from groove 50. Note that since interior corner 58 is rounded, double-hollow tube 82 can form a superior first vacuum seal 84. Additionally, a linear bearing 112 is shown protruding through baseplate penetration 64. Bearing 112 is shown in detail in FIG. 4.

FIG. 3 illustrates the bottom surface of the baseplate 28 again showing vacuum inlet 30 and the smooth-surfaced bottom 86 of baseplate 28 surrounded by the bottom edge 88 of vertical outer wall 54. Immediately within vertical outer wall 54 and directly under each baseplate penetration 64 is a shallow rectangular recess 90 with a set of first threaded receptables 92 extending up to and flush with smooth-surfaced top 56 of the baseplate 28, one first threaded receptacle located on each side of each baseplate penetration 64. Also shown in FIG. 3 is a bearing block assembly 94 located directly under each shallow rectangular recess 90 and each baseplate penetration 64. Exposed on the bottom surface of the bearing block assembly 94 is a rectangular aluminum mounting block 96 with a screw cap 98 extending from a center penetration 100 within the mounting block 96 and a set of two set screws 102 extending from a twin penetration 104 and the set of first threaded receptacles 92 on each side of the screw cap 98. Note, the top plate 22 is visibly mounted on the smooth-surfaced top 56 of baseplate 28. The second section 32 of baseplate 28 is shown as a molded extension of the vertical outer wall 54. Also shown is the outer frame 70, the center frame member 72, the twin rectangular openings 74, the outer edge 76, the inner edge 78, and the hinge 47 used in the sandwich connection with tester interface 36 (shown in FIG. 1). Finally, a molded raised portion 106 is shown located at the inner edge 78 of the second section 32 of baseplate 28 to cause the inner edge 78 to set above the top frame member 80 (as shown in FIG. 2) of tester interface 36 creating a passageway 148 (as shown in FIG. 6) for electrical conductors from the tester interface 36 to the spring probe pressure pins 40 embedded within baseplate 28.

FIG. 4 illustrates a cross-sectional view of the bearing block assembly taken along line 4—4 of FIG. 1. FIG. 4 further illustrates the top plate 22 mounted upon the first section 26 of baseplate 28 and is supported by the continuous double-hollow tube 82 and by return springs 65. Return springs 65 are mounted in the cylindrical cavity 62 in the baseplate 28 for repositioning the top plate 22 when vacuum is released. Top plate 22 rests on the double-hollow tube 82 in the groove 50 which is bordered by baseplate edge 52 and vertical outer wall 54. Note that mounting block 96 is located directly below baseplate penetration 64 in the shallow rectangular recess 90. Also note that a flat side 108 of mounting block 96 is exposed outwardly while a countersunk side 110 of the mounting block has a translational linear bearing 112 pressed therein with a dual concentric O-ring 113. The linear bearing 112 extends to the height of the baseplate 28 and terminates flush with the flat, smooth surface top 56 of baseplate 28. Mounted within and extending from the bottom of top plate 22 and including a second threaded receptacle 114 therein is a guide shaft 116. Guide shaft 116 extends through the linear bearing 112 and the mounting block 96 for aligning the top plate 22 to the baseplate 28. Screw cap 98 is inserted through the bottom of the mounting block 96 and is threaded into guide shaft 116 to secure the top plate 22 to the baseplate 28. Symetrically placed about screw cap 98 along a longest dimension center line 118 on flat side 108 of mounting block 96 are set screws 102. These set screws 102 are fitted into the first threaded receptacles 92. Finally, note that a plurality of standoff stops 120 extends from the bottom surface of top plate 22. It is the void space between top plate 22 and the baseplate 28 that forms a vacuum chamber 122 therebetween.

FIG. 5 illustrates a bottom surface center portion 124 of top plate 22 including a contoured corner 126 located between a peripheral edge 128 and the guide shaft 116. Note that the plurality of standoff stops 120 intermingle with the individual access ports 38.

FIG. 6 illustrates a circuit board 130 under test mounted upon top plate 22 with a second vacuum seal 132 therebetween. Note, second vacuum seal 132 is comprised of a soft closed-cell microform seal 134 which is located under the outer edge of the circuit board 130 and is affixed to the flat, smooth upper surface 24 of top plate 22 by a removable cement 138. The closed-cell microform seal 134 forms a planar seal 142 under vacuum between the bottom printed circuit board 130 and the top plate 22 and also forms an edge-seal 143 under vacuum about the edges of the printed circuit board 130 and the upper surface 24 of top plate 22. The edge seal 143, which is about the outer parameter of the printed circuit board 130, creates a "damming effect" for maintaining the second vacuum seal 132. The closed cell microfoam seal 134 also provides a vertical support position 144 for the printed circuit board 130 in the absence of vacuum. Additionally, the standoff stops 120 are shown extending from the bottom surface center portion 124 of the top plate 22 and spring probe pressure pins 40 are shown extending upward through individual access ports 38 of top plate 22. An electrical coupling 146 is shown within a passageway 148 between the baseplate 28 and the bottom cover plate 34. Passageway 148 is designed for routing and protecting the electrical coupling 146 between the spring probe pressure pins 40 and the external test device 48 shown in FIG. 1. The electrical coupling 146 must pass through the tester interface 36 which is hinged to the baseplate 28 as shown in FIG. 7. The molded channel slots 66 are shown as is the continuous double-hollow tube 82 within the groove 50.

FIG. 7 illustrates the collapsible nature of the hinge 47 between the baseplate bottom surface 86 and the bottom cover plate 34. Included in the smooth-surfaced bottom 86 of baseplate 28 is the vacuum inlet 30, a spring-loaded release lock 160 mounted on an aluminum angle member 162 which is bolted to the smooth-surfaced bottom 86 of baseplate 28 just behind the bottom edge 88. Also shown are the bearing block assemblies 94, the mounting block 96, a set of upper bracket supports 164, a set of collapsible support arms 166, the second section 32, the outer frame 70, the center frame member 72, the twin rectangular openings 74, the outer edge 76 and the inner edge 78. Also shown are the molded raised portion 106 and hinge 47. Included within the bottom cover plate 34 is a set of lower bracket supports 168 and a lock receptacle 170 for spring-loaded release lock 160. The tester interface 36 is shown and includes the top frame member 80 and a set of two pin connector fields 172 for electrical connection to the external test device 48 (as shown in FIG. 1). The hinge 47 is shown bolted to both the top frame member 80 of tester interface 36 and the outer edge 76 of the second section 32 of baseplate 28. Finally, a set of base supports 174 are shown that support the in-circuit tester 20 from below the bottom cover plate 34.

Referring again to FIG. 1, there is shown the top plate 22 in parallel alignment with baseplate 28 and spring probes 40 penetrating the individual access ports 38. In FIG. 3, bearing block assembly 94 has mounting block 96 in physical communication with each of the shallow rectangular recesses 90 within the bottom 86 of the baseplate 28. In FIG. 4, linear bearing 112 is shown pressed into block 96 and passes through one of the baseplate penetrations 64. The bottom of top plate 22 further includes a guide shaft 116 mounted therein which passes through the bearing 112 and the block 96.

Guide shaft 116 includes the second threaded receptacle 114 which receives screw cap 98 for independently adjusting the top plate 22 relative to the baseplate 28 achieving a non-stress position therebetween. Block 96 is rectangular and comprised of aluminum having the center penetration 100 cylindrically countersunk on one side to accommodate the linear bearing 112 and guide shaft 116 which independently align the baseplate penetration 64 with the guide shaft 116. Aligning the base plate penetration 64 with the guide shaft 116 and attaching screw caps 98 adjusts the top plate 22 parallel to and the guide shaft 116 orthogonal to the baseplate 28. Installing the guide shaft 116 into the linear bearing 112 and securing the screw cap 98 on mounting block 96 permits the top plate 22 to be centered relative to the baseplate 28 but yet allows some movement between the top plate 22 and the baseplate 28. This movement facilitates the individual adjustability of each bearing block assembly 94 and permits the top plate 22 and baseplate 28 to be injection molded from non-abrasive, high-strength plastic in lieu of being precision machined metal parts. Once this non-stress position is achieved, the two setscrews 102 are secured within the twin penetrations 104 of block 96 which are symetrically located in the plane of the center penetration 100 along the longest dimension center line 118 of the block 96. This independently secures the bearing block assembly 94 to the first threaded receptacle 92 within the smooth-surfaced bottom 86 of base plate 28. Thus, the position of the linear bearing 112 is fixed relative to the top plate 22 and the baseplate 28. Since the top plate 22 and the baseplate 28 were previously in a non-stress position, securing the setscrews 102 permits the top plate 22 bindless vertical travel via the guide shaft 116 relative to the baseplate 28. As top plate 22 vertically moves relative to the stationary baseplate 28, guide shaft 116 also moves through the linear bearing 112 and the center penetration 100 of mounting block 96. It is the precision alignment of the guide shaft 116 of top plate 22 with the baseplate penetration 64 and the adjusting of each linear bearing 112 individually by securing each mounting block 96 with setscrews 102 that prevent warping of the top plate 22 while under vacuum. The precision alignment also prevents loss of reliable electrical contact between the spring probes 40 and the circuit board 130 under test.

Referring to FIG. 2, the flat, smooth-surfaced top 56 of baseplate 28 forms the bottom surface of vacuum chamber 122 shown in FIGS. 4 and 6. As vacuum inlet 30, shown in FIGS. 1, 3 and 7, fitted to external penetration 68 through vertical outer wall 54, creates a vacuum in chamber 122 through molded channel slot 66 the top plate 22 is drawn down upon the continuous double-hollow tube 82 within the continuous uniform groove 50. The tube 82 forms a figure-eight in cross-section, and under vacuum conforms to the shape of the uniform groove 50. Since part of the weight of top plate 22 is always preloaded onto double-hollow tube 82, a seal exists in uniform groove 50 in the absence of vacuum. However, under vacuum, the first vacuum seal 84 is held captive between the top plate 22 and the base plate 28 and within the continuous uniform groove 50. First vacuum seal 84 is closed upon itself and seals the rounded interior corners 58 of the baseplate 28 and the contoured corners 126 of top plate 22 shown in FIG. 5 for maintaining the vacuum within chamber 122 and forming a superior seal. The molded, rounded interior corners 58 are shown in FIG. 2 and more precisely in FIG. 2A where there is illustrated the continuous uniform groove 50 formed between the baseplate edge 52 and the smooth-surfaced top 56 of baseplate 28. The vertical outer wall 54 and the outer corner 60 are also shown. Note that rounded corner 58 permits the double-hollow tube 82 to closely fit the interior of the corner 58 thus providing the superior seal. The rounded interior corners 58 and the preloaded double-hollow tube 82 both contribute to prevent vacuum leakage, warping of the circuit board 130 and poor electrical contact between the spring probes 40 and the circuit board 130 shown in FIG. 6. Further vacuum sealing is provided by the O-ring seal 113 shown in FIG. 4 located in the countersunk side 110 of mounting block 96 where linear bearing 112 has been pressed therein.

As previously mentioned, the adjustable bearing block assembly 94 provides precision alignment between the top plate 22 and the baseplate 28. Thus, because of this adjustability the in-circuit test apparatus 20 is functional without possessing the machine design accuracy as heretofore required. Therefore, to provide the in-circuit test apparatus 20 with component parts that are electrically insulated but which are not subjected to high tolerance measurement machining, the top plate 22 and the baseplate 28 are injection molded using a non-abrasive, high-strength plastic comprised of a thermoplastic polyester molding compound. Since this insulating material has the characteristics of strength, rigidity, flatness and temperature resistance, lower measurement tolerance injection molded materials may be used.

Referring to FIGS. 1, 5 and 6, when a vacuum is drawn by vacuum inlet 30 the double-hollow tube 82 forms a vacuum seal between the top plate 22 and the baseplate 28 as previously described. The top plate 22 is then drawn down onto double-hollow tube 82 as the guide shaft 116 travels vertically downward through linear bearing 112 shown in FIG. 4. The plurality of spring probe pressure pins 40 mounted within the vacuum chamber 122 between the baseplate 28 and top plate 22 project through the top plate 22 when vacuum is applied making electrical communication with the printed circuit board 130 under test. Because of the adjustability of the bearing block assembly 94 and the precision accuracy resulting therefrom, individual access ports 38 for each of the spring probe pressure pins 40 may be precision drilled in the top plate 22 and any resulting drilling error may be compensated for. The access ports 38 provide for guiding and protecting each spring probe 40 as the top plate 22 vertically travels along with the guide shaft 116 relative to the baseplate 28. Protection exists for the spring probes 40 whether the in-circuit test apparatus 20 is under vacuum or not.

Referring to FIG. 6 there is illustrated the second vacuum seal 132 mounted above the top plate 22 and having the bottom surface of the closed-cell microfoam seal 134 removably affixed to the flat, smooth upper surface 24 of top plate 22. The bottom surface of the microfoam seal 134 and the top surface 24 of top plate 22 lying directly beneath microfoam seal 134 are coated with a removable cement 138. After the cement 138, which is a neoprene derivative, is permitted to set, microfoam seal 134 is pressed onto top plate 22. The cement 138 may be peeled off upon removal of microfoam seal 134, leaving all surfaces clean. This method facilitates in the rapid removal and replacement of the second vacuum seal 132. The second vacuum seal 132 which is comprised of closed-cell microfoam 134 is a neoprene tubular material that has sufficient height to hold the printed circuit board 130 above the spring probes 40 in the absence of vacuum. Additionally, the second vacuum seal 132 surrounds the individual access ports 38 in the top plate 22 forming the planar seal 142 under vacuum between the access ports 38 and the printed circuit board 130 under test. Thus, the second vacuum seal 132 provides an even distribution of vacuum without distorting the circuit board 130 and returns the circuit board 130 to the vertical support position 144 in the absence of vacuum. The closed-cell microfoam seal 134 maintains integrity and resiliency while under vacuum thus providing good spring probe 40-to-circuit board 130 contact.

Again referring to FIG. 5, there is shown a perspective view of the bottom surface of the top plate 22 illustrating the center portion 124 having peripheral edges 128 and which includes an array of standoff stops 120 distributed about the bottom center portion 124. The standoff stops 120 are injection molded to the bottom surface of the top plate 22 for preventing the bottom surface of the top plate 22 from contacting the top surface 56 of the baseplate 28 causing vacuum pinchoff within the chamber 122. The standoff stops 120 provide a precision separation distance and a physical dead stop and are not deformable, will not warp and, empirically, only six standoff stops 120 are necessary to prevent vacuum pinchoff.

Referring again to FIG. 4, the guide shaft 116 including the second threaded receptacle 114 therein also includes the screw cap 98 threadedly connected at the end of the shaft 116 located on the flat side 108 of the mounting block 96. The screw cap 98 is unscrewed by thumb pressure for disassembling the top plate 22 from the base plate 28. The in-circuit test apparatus 20 is assembled with four guide shafts 116 mounted to the top plate 22, each inserted in the bearing block assembly 94 in each quadrant. By providing a screw cap 98 that is finger adjustable, the in-circuit test apparatus 20 can be disassembled while engaged to the tester interface 36 by removing the four screw caps 98. The guide shafts 116 need not be removed. Also FIG. 4 illustrates the plurality of return springs 65 mounted within the cylindrical cavities 62 within the baseplate 28 for repositioning the top plate 22 of the vacuum chamber 122 when the vacuum is released. Two return springs 65 are shown in FIG. 4 for illustration purposes, however, eight return springs 65 are used in each in-circuit test apparatus 20 and repositioning the top plate 22 is their only purpose.

Referring again to FIG. 7, the sandwich collapsible nature of the test apparatus 20 is illustrated. The baseplate 28 pivots about the bottom cover plate 34 via hinge 47. In the open position, as illustrated, the baseplate 28 is supported by the collapsible support arms 166 which include a lock position. The support arms 166 are anchored in the baseplate at the upper bracket support 164 and in the bottom cover plate at the lower bracket supports 168. Note that the spring-loaded release lock 160 in the baseplate 28 mates with the lock receptacle 170 in the bottom cover plate 34 when the test apparatus 20 is collapsibly closed to secure the test apparatus 20 during operation. Also note the molded raised portion 106, as shown in FIGS. 3 and 7, mates with the top frame member 80 to provide the wiring passageway 148 (as shown in FIG. 6) to and from the pin connection fields 172. A major advantage of the collapsible test apparatus 20, as shown in FIG. 7, is that the test apparatus 20 can be installed in the external test device 48 (as shown in FIG. 1) with vacuum drawn and the operator still has access to the tester interface 36, the pin connection fields 172 and all associated wiring. This is possible because, as shown in FIG. 4, the vacuum chamber 122 is located between the baseplate 28 and the top plate 22. If the printed circuit board 130 is mounted above microfoam seal 134 (as shown in FIG. 6) and vacuum seals 84 (as shown in FIG. 4) and 132 (as shown in FIG. 6) are intact, then the lock 160 may be released and baseplate 28 rotated about bottom cover plate 34 without disturbing the vacuum or the contact between the spring probe pressure pins 40 and the printed circuit board 130, as shown in FIG. 6.

Finally, referring to FIG. 1 there is illustrated the top access cover plate 42 mounted atop the second section 32 of the baseplate 28 having the flat, smooth upper surface 46 and the thumb screw release 44 for providing access to the tester interface 36.

Although, the present invention has been described terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. An in-circuit test apparatus for printed circuit boards, comprising in combination:

a baseplate having a first and second section, said first section including a top surface having a continuous groove about a baseplate edge forming a vertical outer wall, said groove having molded rounded interior corners, a channel slot with a cylindrical cavity at each end and an external penetration through said vertical outer wall, and further including a bottom surrounded by said vertical outer wall having at least one baseplate penetration adjacent to each of said rounded interior corners, said baseplate penetration piercing a shallow rectangular recess having a first threaded receptacle within the baseplate bottom, said second section including an outer frame molded to said first section, said outer frame including a hinge for connecting said outer frame to a tester interface;

a top plate mounted atop said first section forming a chamber therebetween and having a flat, smooth upper surface, and a bottom surface with a center portion having peripheral edges and including an array of standoff stops distributed about said bottom center portion, and at least a single guide shaft for aligning the top plate with said base penetration and having contoured corners symmetrically matching said rounded interior corners of the baseplate;

a vacuum inlet fitted to said external penetration through the baseplate vertical outer wall for creating a vacuum within said chamber;

a first vacuum seal held captive between the top plate and the baseplate and within said continuous groove, the vacuum seal being closed upon itself and sealing said rounded interior corners of the baseplate and said contoured corners of the top plate for maintaining said vacuum within said chamber; and a bearing block assembly having an adjustable mounting block in physical communication with each of said shallow rectangular recesses within said baseplate bottom and a linear bearing pressed into said block and passing through one of said baseplate penetrations and further comprising a second threaded receptacle located within said guide shaft, said guide shaft passing through said bearing and said block for independently adjusting the top plate relative to the baseplate.

2. The in-circuit test apparatus of claim 1 wherein said top surface of the baseplate is a flatsmooth surface and the continuous groove is uniform along the lengths of said baseplate edge, said vertical outer wall is the height of said top, said molded channel slot is parallel to said baseplate edges and inward from said continuous groove, said bottom is smooth-surfaced and supported above the bottom edge of said vertical outer wall and said shallow rectangular recess having at least two first threaded receptacles, and said second section further including a center frame member equally dividing said outer frame, each being the height of said vertical outer wall and forming twin rectangular openings, said tester interface including a top frame member being releasable from said baseplate bottom by said hinge.

3. The in-circuit test apparatus of claim 1 wherein the mounting block comprises a rectangular aluminum block having a center penetration which is cylindrically countersunk on one side to accommodate said linear bearing and said guide shaft, for independently aligning the penetrations of the baseplate with said guide shafts of the top plate adjusting the baseplate parallel to the top plate and orthogonal to said guide shafts and further including a twin penetration and a setscrew symmetrically located in the plane of said center penetration of said block for independently securing the bearing block assembly to said first threaded receptacles within said bottom of the baseplate permitting the top plate bindless vertical travel with said guide shaft relative to the baseplate.

4. The in-circuit test apparatus of claim 1 wherein the adjustable bearing block assembly provides precision alignment between the top plate and the baseplate.

5. The in-circuit test apparatus of claim 1 wherein said guide shaft includes a screw cap threadedly connected within said second threaded receptacle at the end of said guide shaft, said screw cap located on a flat side of said mounting block and is unscrewable by thumb pressure for disassembling the top plate from the baseplate.

6. The in-circuit test apparatus of claim 1 wherein the top plate and the baseplate are injection molded with a non-abrasive, high-strength plastic and comprised of a thermoplastic polyester molding compound.

7. The in-circuit test apparatus of claim 1 wherein the first vacuum seal located between the baseplate and the top plate is a continuous loop double-hollow tube seal and is comprised of extruded silicone.

8. The in-circuit test apparatus of claim 1 wherein said top plate standoff stops are injection molded to said bottom surface of the top plate for preventing said bottom surface of the top plate from contacting said top surface of the baseplate causing vacuum pinchoff within said chamber.

9. The in-circuit test apparatus of claim 1 further including
   a plurality of return springs mounted within said cylindrical cavities within the baseplate for repositioning the top plate of said vacuum chamber when said vacuum is released.

10. The in-circuit test apparatus of claim 1 further including
   a plurality of spring probe pressure pins mounted within said vacuum chamber between the baseplate and the top plate and projecting rhrough the top plate when vacuum is applied making electrical communication with a printed circuit board under test.

11. The in-circuit test apparatus of claim 10 wherein said tester interface hinged to the baseplate further includes an electrical coupling between said spring probe pressure pins and a external test device.

12. The in-circuit test apparatus of claim 11 further including
   a top access cover plate mounted atop said second section of the baseplate having a flat, smooth upper surface and a thumb screw release for providing access to the tester interface.

13. The in-circuit test apparatus of claim 11 further including
   a bottom cover plate connected to said tester interface for routing and protecting said electrical coupling between said spring probe pressure pins and said external test device.

14. The in-circuit test apparatus of claim 10 further including
   an individual access port for each of said spring probe pressure pins precision drilled in the top plate for guiding and protecting each spring probe as the top plate vertically travels along with said guide shaft relative to the baseplate.

15. The in-circuit test apparatus of claim 14 further including
   a second vacuum seal mounted above the top plate comprised of a closed-cell microfoam seal and having a bottom surface of said microfoam seal affixed to said smooth upper surface of the topplate by a removable adhesive for the rapid removal and replacement of said second vacuum seal.

16. The in-circuit test apparatus of claim 15 wherein said second vacuum seal surrounds said individual access ports in the top plate forming a planar seal under vacuum between said upper surface of the top plate and said circuit board under test and said closed cell microfoam seal further forming an edge seal under vacuum between an outer edge parameter of said circuit board under test and said upper surface of the top plate, said closed cell microfoam seal providing a perimeter vacuum damming effect and providing an even distribution of vacuum without distorting said circuit board returning said circuit board to a vertical support position in the absence of vacuum.

17. An in-circuit test apparatus for printed circuit boards, comprising in combination:
   a baseplate having a first and second section, said first section including a flat. smooth-surfaced top having a continuous uniform groove along the lengths of a baseplate edge forming a vertical outer wall of the height of said top, said continuous groove having molded rounded interior corners, a molded channel slot parallel to said baseplate edges and inward from said continuous groove with a cylindrical cavity at each end and an external penetration through said vertical outer wall, and further including a smooth-surfaced bottom supported above the bottom edge of said vertical outer wall having at least one baseplate penetration adjacent to each of said rounded interior corners, said baseplate penetration piercing a shallow rectangular recess having at least a single first threaded receptacle within the baseplate bottom, said second section including an outer frame molded to said first section and a center frame member equally dividing said outer frame, each being the height of said vertical outer wall and forming twin rectangular openings;
   a top plate mounted atop said first section forming a chamber therebetween and having a flat, smooth upper surface, and a bottom surface with a center portion having peripheral edges and including an array of standoff stops distributed about said bottom center portion, and further including at least a single guide shaft for aligning the top plate with said baseplate penetration and having a contoured corner symmetrically matching said rounded interior corners of the baseplate;
   a vacuum inlet fitted to said external penetration through the baseplate vertical outer wall for creating a vacuum within said chamber;
   a first vacuum seal held captive between the top plate and the baseplate and within said continuous uniform groove, the vacuum seal being closed upon itself and sealing said rounded interior corners of the baseplate and said contoured corners of the top plate for maintaining said vacuum within said chamber;
   a plurality of return springs mounted within said cylindrical cavities within the baseplate for repositioning the top plate of said vacuum chamber when said vacuum is released;
   a bearing block assembly having an adjustable mounting block in physical communication with each of said shallow rectangular recesses within said baseplate bottom and a linear bearing pressed into said block and passing through one of said baseplate penetrations and further comprising a second threaded receptacle located within said guide shaft, said guide shaft passing through said bearing and said block for independently adjusting the top plate relative to the baseplate.
   a plurality of spring probe pressure pins mounted within said vacuum chamber between the baseplate and the top plate and projecting through the top plate when vacuum is applied making electrical communication with a printed circuit board under test;
   a tester interface hinged to the baseplate and having an electrical coupling between said spring probe pressure pins and an external test device; and
   a bottom cover plate connected to said tester interface for routing and protecting said electrical croupling between said spring probe pressure pins and said external test device.

* * * * *